United States Patent [19]

Ignasiak et al.

[11] Patent Number: 4,750,889
[45] Date of Patent: Jun. 14, 1988

[54] THROUGH-BOARD ELECTRICAL COMPONENT HEADER HAVING INTEGRAL SOLDER MASK

[75] Inventors: Martin C. Ignasiak, Mentor; Remi D. Swierczek, Concord, both of Ohio

[73] Assignee: Minnesota Mining & Manufacturing Company, St. Paul, Minn.

[21] Appl. No.: 19,566

[22] Filed: Feb. 27, 1987

[51] Int. Cl.$^4$ .............................................. H01R 9/09
[52] U.S. Cl. ........................................ 439/83; 29/843; 228/180.1; 439/857
[58] Field of Search ............... 439/81, 82, 83, 876, 439/857; 29/837, 839, 840, 843; 228/215, 180.1; 361/400–406

[56] References Cited

U.S. PATENT DOCUMENTS

| | | | |
|---|---|---|---|
| 3,059,152 | 10/1962 | Khouri | 174/68.5 |
| 3,246,386 | 4/1966 | Ende | 228/180 |
| 3,524,960 | 8/1970 | Lohff | 29/832 |
| 3,525,143 | 8/1970 | DeVito | 228/180.1 |
| 3,604,836 | 9/1971 | Pierpont | 361/405 |
| 3,941,444 | 3/1976 | Bruni et al. | 439/587 |
| 3,989,331 | 11/1976 | Hanlon | 439/83 |
| 4,246,627 | 1/1981 | Poensgen | 361/405 |
| 4,350,856 | 9/1982 | Shiratori et al. | 361/400 |
| 4,373,655 | 2/1983 | McKenzie | 228/180 R |
| 4,645,278 | 2/1987 | Yevak, Jr. et al. | 29/837 |

FOREIGN PATENT DOCUMENTS 602704 8/1960 Canada .

OTHER PUBLICATIONS

Skip A Dip, Micro Electronic Systems, Inc.

Primary Examiner—Neil Abrams
Attorney, Agent, or Firm—Renner, Otto, Boisselle & Sklar

[57] ABSTRACT

An electrical component for electrical interconnection of electrical elements includes an electrically non-conducting body containing at least one cavity for receiving an electrically conducting member, an opening for access to the cavity, a solder mask disposed proximate the opening for preventing the flow of molten solder through the opening and a frangible connection between the mask and the body. An electrical contacting member disposed within the cavity, preferably through a second opening, includes a solder tail that passes through the opening adjacent the mask. The component, containing the contacting member, is disposed on the top side of a printed circuit board with the solder tail, and preferably the mask, inserted into a plated-through hole in the board and protruding from the bottom side of the board. The solder tail is soldered to the board in a wave soldering process during which the mask prevents molten solder from entering the cavity. Thereafter, the solder mask may be removed by breaking the frangible connection so that an electrical lead can be inserted into the cavity from the bottom side of the board.

25 Claims, 3 Drawing Sheets

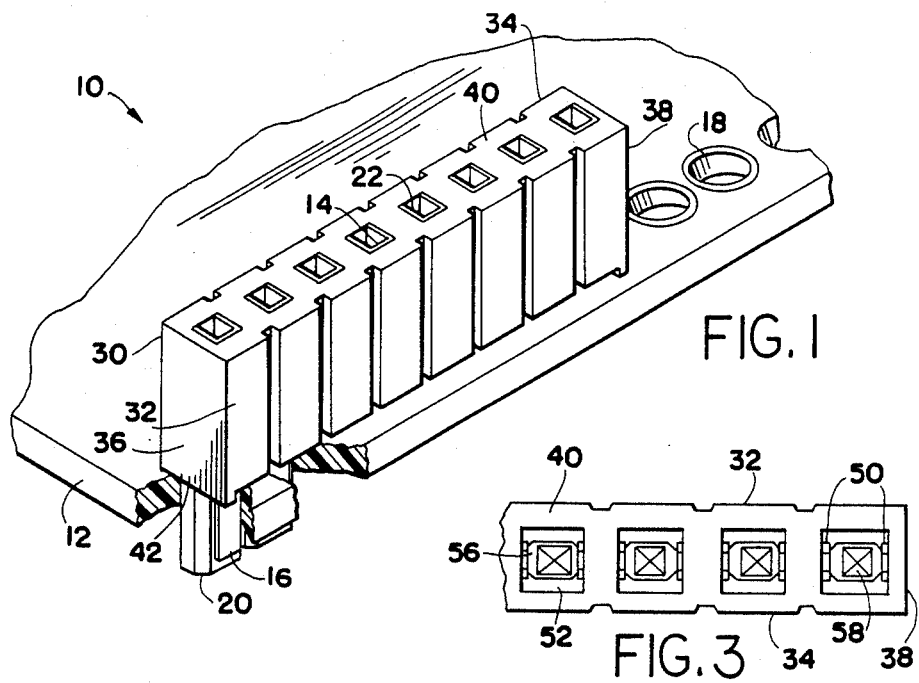
FIG. 1
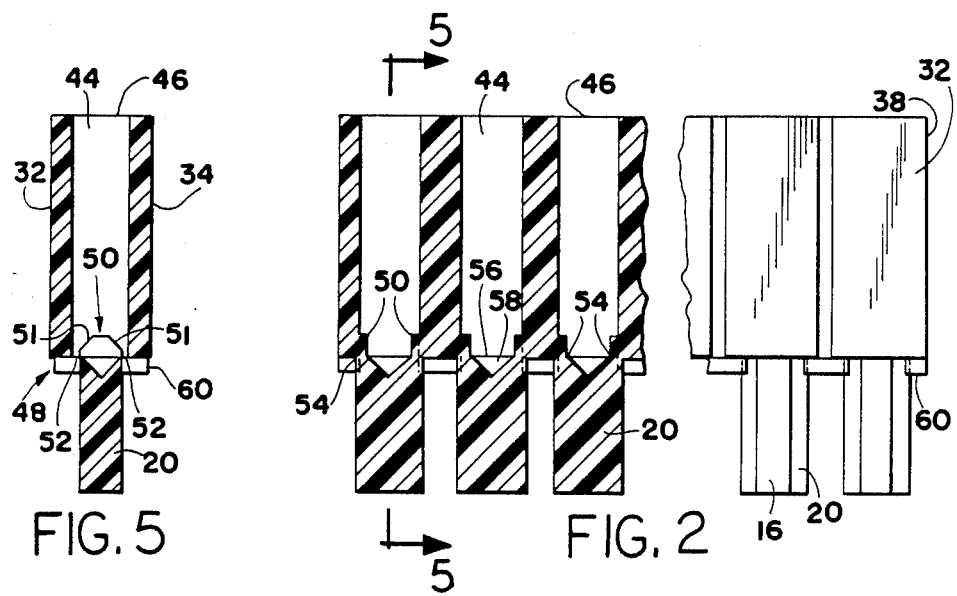
FIG. 3
FIG. 5
FIG. 2
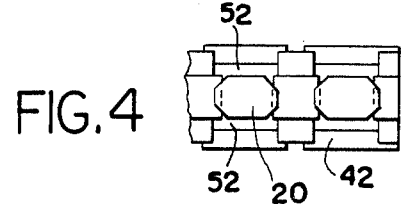
FIG. 4

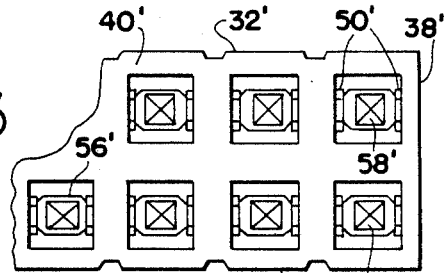
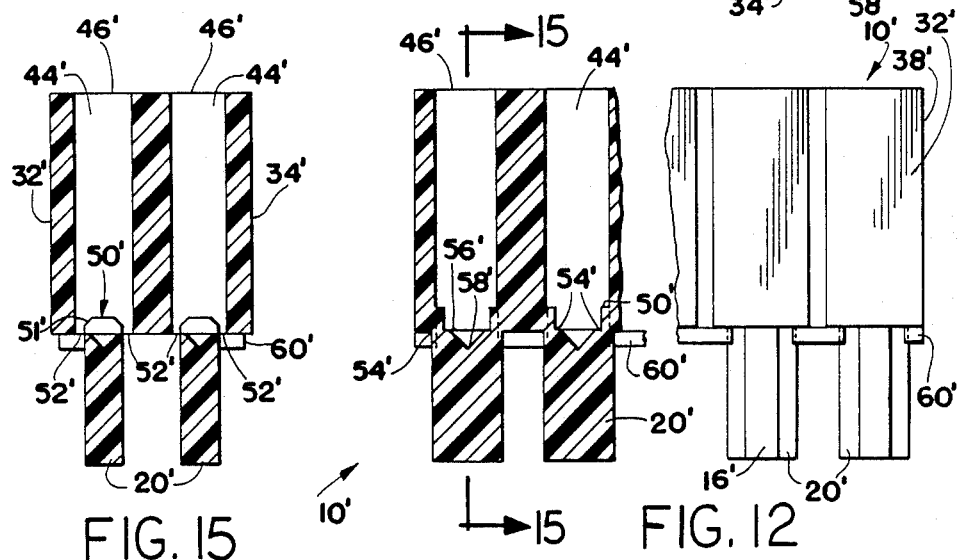
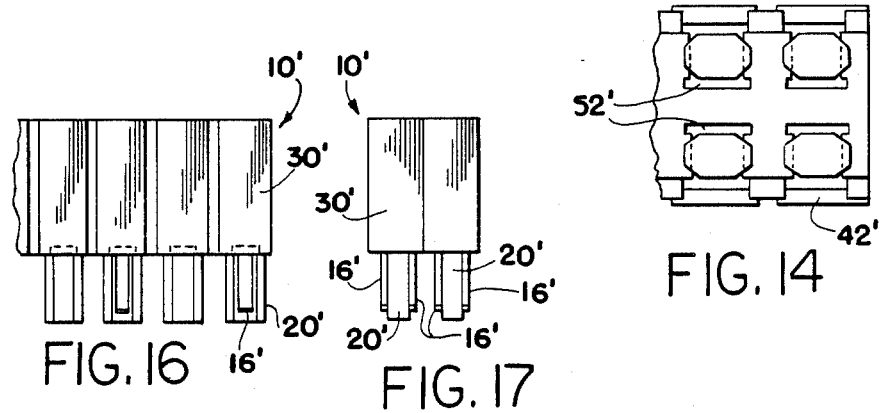
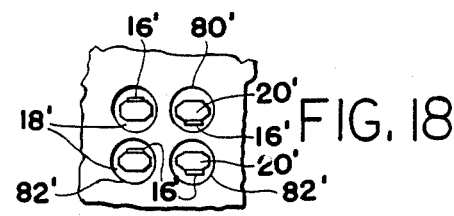

THROUGH-BOARD ELECTRICAL COMPONENT HEADER HAVING INTEGRAL SOLDER MASK

TECHNICAL FIELD

The invention relates generally to electrical components, more particularly to electrical connectors, and even more particularly, to through-board female headers with integral solder masks enabling access to the header contacts from both sides of the board.

BACKGROUND

The use of mass soldering techniques to attach electrical components to a common support structure is well known. One exemplary process is that known as wave soldering; others are known. One common support is a printed circuit board; others are known. Various types of electrical components, such as connectors, sockets and the like, provide interconnecting electrically conductive paths on or in a printed circuit board. These components electrically interconnect other electrical components or elements, such as resistors, capacitors, conductors, transistors, integrated circuits, etc.

The invnetion is described below with reference to a female type header that provides a socket for receiving pin contacts from another connector or other component for connecting the same to circuits on a printed circuit board. The description is directed to use of such a header and circuit board in a wave soldering process. However, it will be appreciated that the features of the invention may be used in connection with other types of components, other types of common support structures, other types of mass soldering techniques, and so on.

In a typical process for manufacture circuitry employing a printed circuit board with components mounted on the board and wave soldered, the leads or solder tails (hereinafter simply referred to as solder tails) of electrical components are positioned in respective holes, preferably plated-through holes, in the printed circuit board. The plating in the holes is electrically connected to respective conductive paths or the like, printed on or otherwise formed with respect to the printed circuit board. The printed circuit board is passed through a molten solder wave that wipes against a surface of the printed circuit board to solder the connections between the solder tails and plated-through holes or other conductive paths or the like on the board.

Usually, some of the solder flows into the plated-through holes. Ordinarily, any space left between a lead and a plated-through hole would be expected to be filled with solder.

SUMMARY OF THE INVENTION

According to the present invention, an electrical component is provided with features that enable solder tails or the like to be attached to plated-through holes of a printed circuit board while those holes are occupied both by solder tails and by a mask that prevents molten solder from completely filling the hole. During wave soldering, adequate solder is provided to effect soldering of the solder tails to the conductive material (plating) in the holes and/or on the top or bottom of holes, while the mask prevents the hole from filling with molten solder. Preferably, the mask is frangibly attached to a major body portion of the component so that the mask subsequently can be removed, thus providing an open space in the hole. The open space in the hole permits a pin contact or the like to be inserted to engage the contacting portion of the component contact from the solder tail side of the printed circuit board.

Further, in accordance with the invention there is provided an electrical component to be mounted to a circuit board, comprising: an electrically insulating body for supporting an electrically conducting member to be soldered to a conductive path on a circuit board; a solder mask extending from one side of the body to be inserted in a hole in the circuit board for occupying space in the hole in the circuit board during soldering of the conductive member to the conductive path on the circuit board; and a frangible connection for securing the solder mask to the body until the conducting member is soldered to the conductive path on the circuit board and for permitting detachment of the solder mask from the body after such soldering and removal of the solder mask from the body hole thereby to provide an open space in the hole through which access may be had from one side of the board to the opposite side of the board such as for insertion of a terminal therethrough.

Also provided by the invention is an electrical component to be mounted to a circuit board, comprising: an electrically nonconducting body having a cavity and an opening at one side of the body for permitting access to the cavity; an electrically conducting member mounted within the cavity, the electrically conducting member including a solder tail extending through the opening and from the one side of the body for inserting into a hole in a circuit board and for electrically connecting with a conductive path on the circuit board by soldering; a mask proximate the opening for blocking flow of molten solder through the opening for preventing solder from filling the cavity; and frangible connecting means for connecting the mask to the body until the solder tail is soldered to the conductive path on the circuit board and for permitting detachment of the mask from the body after such soldering thereby to open the opening for providing access to the cavity from the one side of the body.

The invention also provides a method of mounting a female header on a circuit board for access to the header from either side of the board after mounting, the header including an electrically nonconducting body, an electrically conducting member having a solder tail, such member being partially disposed within a cavity in the body, the solder tail extending through an opening in the body and a solder mask extending from the body proximate the solder tail and partially blocking the opening, said method comprising: inserting the solder tail and solder mask into a hole in the circuit board from the top surface of said board, the board including a solderable contact in or proximate the hole; applying molten solder to the board and solder tail to interconnect the solderable contact and tail with solder; and detaching the solder mask from the body to give access to the electrically conducting member through the hole and opening.

With the foregoing in mind, one aspect of the invention relates to an electrical component including an electrically nonconducting body, a cavity in the body containing at least part of an electrically conducting member therein, an opening in the body for access to the cavity, a mask for preventing flow of molten solder or the like, and a frangible connecting mechanism to connect the mask to the body.

According to another aspect, the aforementioned electrical component is in the form of a female header having plural openings and contacts therein with solder tails extending from the openings. The mask is in the form of plural pin-like masks that extend generally parallel to respective solder tails.

According to still another aspect, the contacts of such an electrical component are box-type contacts, and the cavity has openings at opposed ends so that the contacting portions of respective contacts can be engaged by a member inserted from either end of the cavity.

According to still another aspect, the invention relates to the combination of an electrical component of the type described together with a printed circuit board enabling a contact of the component to be engaged from either side of the printed circuit board.

The foregoing and other objects, aspects, features and advantages of the present invention will become further apparent from the following description with reference to the accompanying drawings.

To the accomplishment of the foregoing and related ends, the invention, then, comprises the features hereinafter fully described in the specification and particularly pointed out in the claims, the following description and the annexed drawings setting forth in detail certain illustrative embodiments of the invention, these being indicative, however, of but several of the various ways in which the principles of the invention may be employed.

Although preferred embodiments of the invention are disclosed, it will be appreciated that the scope of the invention is to be determined by the scope of the claims.

BRIEF DESCRIPTION OF THE DRAWINGS

In the annexed drawings:

FIG. 1 is an isometric view of an electrical component in accordance with the invention in the form of a through-board female header positioned in a printed circuit board, part of the circuit board being broken away to show the solder tails and solder masks of the headers;

FIG. 2 is a fragmentary side elevation view of the header, partly broken away in section;

FIG. 3 is a fragmentary top view of the header of FIG. 2;

FIG. 4 is a fragmentary bottom view of the header of FIG. 2;

FIG. 5 is an end elevation view, partly in section, of the header of FIG. 2;

FIG. 12 is a side elevation view of a dual in-line row header according to the invention, partly in section;

FIG. 13 is a top view of the header of FIG. 12;

FIG. 14 is a bottom view of the header of FIG. 12;

FIG. 15 is an end view, partly in section, of the header of FIG. 12;

FIG. 16 is a fragmentary side view of a dual in-line row header with contacts therein;

FIG. 17 is an end view of the header of FIG. 16; and

FIG. 18 is a schematic bottom view of the header of FIG. 16 as the solder tails and masks would appear in plated-through holes looking from the bottom of a printed circuit board into which the header is inserted.

DESCRIPTION OF THE PREFERRED EMBODIMENTS

Figure 6:
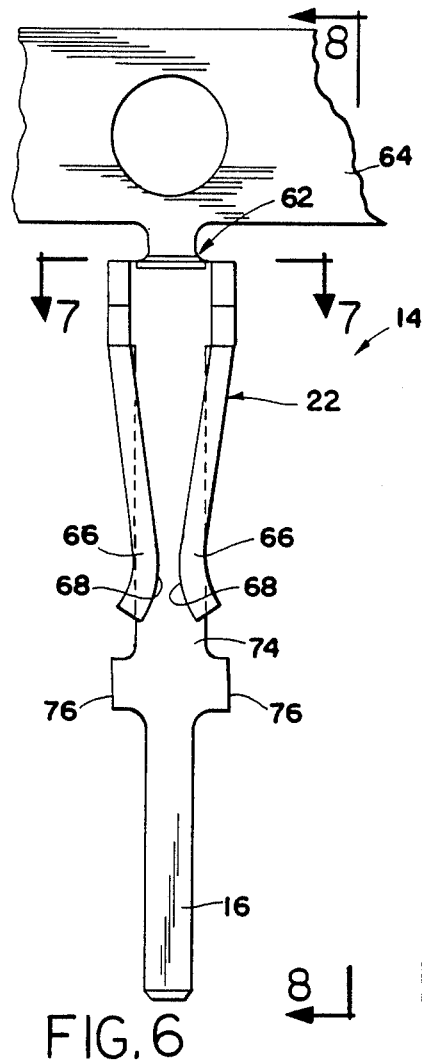
FIG. 6 is an end elevation view of a box contact used in the header, such contact being shown attached to a breakaway carrier strip for convenient manipulation.

Referring now in detail to the drawings, wherein like reference numerals designate like parts in the several figures, and initially to FIG. 1, an electrical component in the form of a through-board female header with integral solder masks is generally designated 10. The header 10 is shown in FIG. 1 mounted with respect to a printed circuit board 12 for the purpose of providing electrical connections between electrically conductive paths (not shown) on or in the board and further electrically conductive members that are inserted to engage respective contacts 14 of the header. The contacts accordingly have solder tails 16 that are attached by solder to electrically conductive plating in plated-through holes 18 of the printed circuit board. Advantageously, as will become apparent from the following description, using pin-like solder masks 20 of the header 10 to occupy some of the area not occupied by a solder tail 16 in a plated-through hole prevents molten solder from fully filling such hole. After removal of the solder mask, a contacting portion 22 of the contact may be engaged by an external member inserted with respect to header 10 and board 12 from either side, i.e., from either the top or bottom thereof, as is illustrated in FIG. 1.

The ability to make connections with the contacting portions 22 of the header 10 from either or both sides thereof, and from either or both sides of the printed circuit board 12, facilitates stacking of boards and/or making connections with boards in dense packing of the boards and/or circuits thereon. In connection with stacking of boards, it will be appreciated that one or more printed circuit boards 12 having headers 10 thereon may be stacked on a single group of pin contacts supported from a main mother board or the like.

Referring to FIGS. 1–5, the header 10 includes an electrically nonconductive or insulator body 30. The body has exterior side surfaces 32, 34, end surfaces 36, 38, top 40 and bottom 42. The body 30 may be made by plastic injection molding techniques. Exemplary material of which the body 30 may be made includes Rynite FR530 which is a glass filled PTE (polyethylene teraphthalate) polyester available from E.I. DuPont de Nemours and Company of Wilmington, Del.

Within the body 30 are a plurality of cavities 44 that extend through the body. Openings 46 in the top 40 permit access to the cavities from the top of the header. The openings generally indicated at 48 are provided for access to the bottom of the cavities 44. Shelf walls 50 in each cavity may be provided to aid in properly positioning respective contacts 14 during their insertion into the cavities in the desired relation to the body 30. Shelves 50 preferably include oblique surfaces 51 facing toward opening 46 for guiding contacts 14 into the proper location in cavity 44.

Covering at least part of the bottom openings 48 are a plurality of pin-like solder mask members 20. Each solder mask member is elongate; preferably the length is adequate to extend fully through and partly beyond a plated-through hole 18 of the printed circuit board 12. The cross-sectional shape of the solder mask pins 20 may be uneven, octagonal, as seen in FIG. 4, for example. The mask pins 20 are attached to the body 30 in proximity to respective openings 48 to cover at least part of such openings while providing a clearance 52 on both sides of the mask. The clearances 52 are sufficiently large to receive therethrough respective solder tails 16, on the one hand, and are sufficiently small to tend to block the flow of molten solder into respective cavities 44, especially during wave soldering, on the other hand. The flowing of molten solder into such cavities 44 could impede proper operation of the contacting portiton 22 of respective contacts 14 and/or could tend to block access to such contacting portions, particularly from the bottom thereof.

A frangible connection 54 is provided for each of the mask pin members 20. The frangible connection is formed by a directly molded piece of plastic or like material of which both the body 30 and pins 20 are made during a single injection molding process, for example. The frangible connection or connection material 54 preferably is at two sides of each pin 20. The frangible connection preferably is sufficiently strong to retain the mask pins 20 attached to the body 30 in position, as is illustrated, blocking the openings 48, while being sufficiently weak to permit breaking thereof for removal purposes. Breaking of the frangible connections 54 and removal of mask pins 20 may be effected by inserting a pin-type tool or pin-like contact member into the cavity 44 from the top opening 46 and pressing the same against the top 56 of the mask pin intended to be removed. A recess, groove or guiding slot 58 is provided in top 56 to guide such a tool generally to apply force evenly to a mask pin 20 to fracture both frangible connecting members 54 of a respective mask pin substantially simultaneously.

Preferably the plated-through holes 18 are larger than those typically found in printed circuit boards. Such larger size is provided to accommodate both the solder tails 16 and solder mask pins 20 therein. Additionally, at the bottom 42 of the header body 30, standoffs 60 are provided for the usual purposes of maintaining bottom 42 of header 10 slightly spaced away from the top surface of the printed circuit board, for example, for cleaning, for heat dissipation, and so on.

Figure 7:
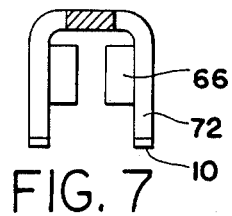
FIG. 7 is a top view of the contact of FIG. 6 looking generally in the direction of the arrows 7—7.
Figure 8:
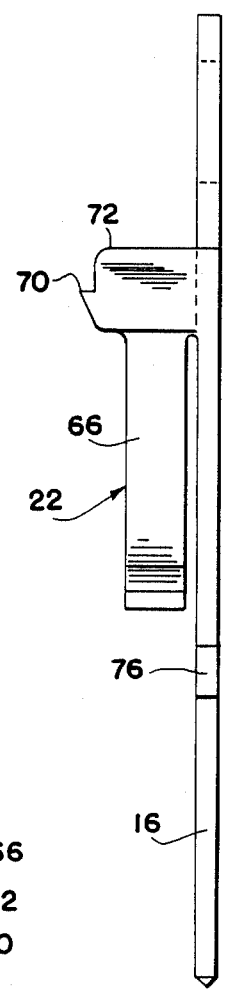
FIG. 8 is an end elevation view of the contact of FIG. 6 looking generally in the direction of the arrows 8—8.

Referring to FIGS. 6-8, an exemplary contact 14 is shown in detail. The contact includes a solder tail 16 and a contacting portion 22. The top end of the contact 14 is attached at a breakaway or frangible connection 62 to a carrier strip 64 which is provided to support a plurality of contacts for convenience of handling the same and inserting them simultaneously into the insulator body 30. The contacting portion is in the form of a box-type contact having a pair of arms or tines 66 with wiping portions 68 intended to wipe against a pin contact or the like inserted in engagement therewith. Near the top of the arms 66 is a sharp, spike-like protrusion 70 intended to bite into a wall of a respective cavity 44 to lock the respective contact in position in the cavity. Ordinarily, such positioning results in the top 72 of the contact being generally parallel to the top surface 40 of the insulator body 30.

Contact 14 includes a generally linear support structure 74 with a pair of protruding arms 76 that may cooperate, for example, with the shelves 50 in the cavity 44 to position contact 14 during insertion of the contact into the cavity. The lower surfaces of arms 76 may slide on oblique surfaces 51 of shelves 50 to guide contact 14 for proper seating in cavity 44. At the bottom end of the support structure 74 is the solder tail 16. Solder tail 16 preferably is relatively wide and flat, as is illustrated, so as to fit in the clearance area 52 at the bottom of the header body 30 and to fit properly into a plated-through hole 18 of the printed circuit board 12.

The header 10 may be made by molding the insulator body 30, forming the contacts 14 in the manner illustrated, and then inserting the contacts with respect to the cavities 44. Insertion ordinarily would take place by inserting the solder tails 16 into the top openings 46; continuing to insert the solder tails 16 through respective clearance areas 52, and finishing the insertion with the arms 76 resting at the bottom of cavity 44. During the insertion, the barb or point 70 will bite into the side wall of the cavity 44 inhibiting withdrawal of the contact from the cavity. Preferably, the contact is pressed down into the cavity far enough so that the top 72 is generally parallel to the top 40 of the insulator body 30. After a plurality of contacts 14 carried by a carrier strip 64 have been so inserted into the insulator body 30, the strip 64 can be broken away and discarded.

Figures 9, 10:
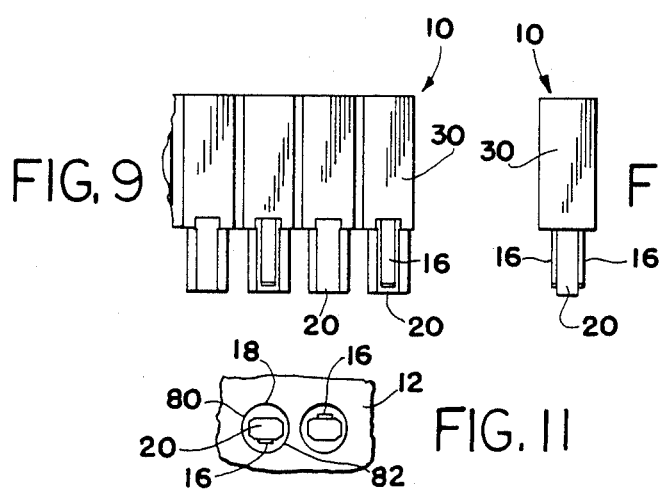
FIG. 9 is a fragmentary side view of a single row header with contacts therein.
FIG. 10 is an end view of the header of FIG. 9.
Figure 11:
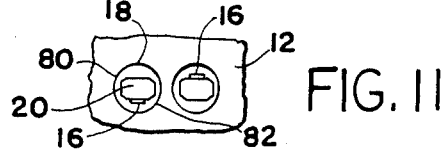
FIG. 11 is a schematic bottom view of the header of FIG. 9 showing positioning of the solder tails and solder masks as they would appear in plated-through holes of a printed circuit board.

Briefly referring to FIGS. 9 and 10, as well as to FIG. 1, the relative positioning of the contacts, particularly the solder tails 16, relative to the insulator body 30 and the solder mask pins 20 thereof may be seen. The header 10 is shown as a single row header having a single row of contacts. The number of contacts in the row may vary, depending on the need, from only one to more than forty. As illustrated in FIGS. 9-11, the position of solder tails 16 with respect to mask pins 20 may vary. In those Figures, every other solder tail along the row of mask pins is disposed on an opposite side of a mask pin 20. The staggered solder tail arrangement adds to the mechanical stability of header 30 when mounted in resisting bending moments.

FIG. 11 is a view looking up from the botttom of the printed circuit board 12. The margin 80 of two plated-through holes 18 is shown. The position of the solder mask pin member 20 in the holes 18 and the relative position of the solder tails 16 also are shown. Desirably, adequate space is provided at 82 to perit molten solder to flow during wave soldering to effect a solder connection of the solder tail 16 to the electrically conductive plating material or the like in the hole 18. What happens on the other side of the hole in the space not occupied by a solder tail is immaterial to the operation and advantages of the invention. Importantly, though, a large amount of space is occupied by the solder mask pin member 20 so that when member 20 is removed in the manner described above, an open area is provided in the hole 18 large enough to accommodate a pin contact intended to be inserted therethrough.

Turning briefly to FIGS. 12 $\propto$ 18, a dual in-line row configured header 10' is illustrated. FIGS. 12-18 are analogous to FIGS. 2-5 and 9-11, respectively. The header 10' and those various parts thereof illustrated in FIGS. 12-18 that correspond to those described above with reference to the header 10 and FIGS. 2-5 and 9-11 are identified with the same reference numerals, but with ' designations. Thus, for example, the header 10' includes an insulator body 30', electrical contacts 14', etc. The arrangement of the cavities 44' in the header 10' and of the contacts 14' associated with such cavities is in dual in-line configuration, a configuration that is well known in the electronics industry. The functioning of the various elements of FIGS. 12–18 is entirely analogous to their counterparts in FIGS. 2–5 and 9–11. Regardless of whether header 10 or 10' is used, a printed circuit board or other support is prepared to receive the header by opening an appropriate number of appropriately spaced holes, each large enough to receive a combined solder tail 16 or 16' and mask pin 20 or 20' in the board. Each hole is either through-plated with a metal or is disposed adjacent a solderable contact on the bottom side of the board. The tails and pins are inserted mechanically into the holes from the top side of the board. The solder tails are subjectd to wave soldering so that mechanical and electrical bonds between the header solder tails and the solderable contacts on the printed cicuit board or other support are formed. Components may be readily connected to the header through its top surface 40 or 40' to connect with one of contacts 14 or 14'. At the contacts 14 or 14' where it is desired to make an electrical connection from the bottom side of the board or support, mask pins 20 or 20' are detached from body 30 or 30'. For example, a tool may be inserted through the openings 46 or 46' opposite the mask pins that are to be removed and the frangible connecting members 54 or 54' detached to open the selected cavities 44 or 44' for access from the bottom side of the board or support. Only those mask pins were connections are to be made from the bottom side of the board need to be broken away. While the depicted headers include a mask pin next to each solder tail, headers according to the invention may include some solder tails that lack corresponding mask pins.

We claim:

1. The method of mounting a female header on a printed circuit board or like support for access to said header from either side of said board after mounting, said header including an electrically non-conducting body, an electrically conducting member having a solder tail, said member being partially disposed within a cavity in said body, said solder tail extending through an opening in said body and a solder mask extending from said body proximate said solder tail and partially blocking said opening, said method comprising:
   inserting said solder tail and solder mask into a hole in said printed circuit board or the like from the top surface of said board, said board including a solderable contact in or proximate said hole;
   applying molten solder to said board and solder tail to interconnect the solderable contact and tail with solder; and
   detaching the solder mask from said body to give access to said electrically conducting member through said hole and opening.

2. The method of claim 1 including inserting a tool into said cavity to contact said solder mask and applying a force to said solder mask with said tool to detach said solder mask from said body.

3. The method of claim 1 including inserting an electrically conducting component from the bottom side of said board through said hole and opening to make an electrical contact with said electrically conducting member.

4. The method of claim 1 wherein said header includes a plurality of electrically conducting members each having a respective solder tail extending through an opening in said body, said members being disposed within different cavities within said body, and a plurality of solder masks, at least some of said masks blocking some of said openings and extending from said body proximate at least some of said solder tails, said method including inserting said solder tails and masks through a plurality of holes in a printed circuit board or the like from the top surface of the board, said board including at least one solderable contact in or proximate at least one of said holes;
   applying molten solder to said board and solder tails to interconnect at least one solder tail and solderable contact with solder; and
   detaching at least one solder mask from said body to give access to one of the electrically conducting members through one of said holes and openings.

5. An electrical component to be mounted to a circuit board, comprising:
   electrically insulating body means for supporting an electrically conducting member to be soldered to a conductive path on a circuit board;
   solder masking means extending from one side of said body means to be inserted in a hole in the circuit board for occupying space in the hole in the circuit board during soldering of the conductive member to the conductive path on the circuit board; and
   frangible connecting means for securing said masking means to said body means until the conducting member is soldered to the conductive path on the circuit board and for permitting detachment of said masking means from said body means after such soldering and removal of said masking means from the hole thereby to provide an open space in the hole through which access may be had from one side of the board to the opposite side of the board such as for insertion of a terminal therethrough.

6. An electrical component as set forth in claim 5, wherein said body means includes a cavity and opening means at said one side of said body means for permitting access to said cavity, and said masking means has a portion thereof disposed to block flow of molten solder through said opening means for preventing solder from filling said cavity.

7. An electrical component as set forth in claim 6, wherein said cavity extends through said body means from said opening means at said one side of said body means to opening means at the opposite side of said body means for permitting access to said cavity, whereby said cavity is accessible from said one and opposite sides of said body means.

8. An electrical component as set forth in claim 7, wherein said masking means includes a mask pin generally aligned with said cavity and having an end exposed through said cavity to said opposite side of said body means, and frangible connecting means including means for breaking upon application of force to said end of said mask pin by an implement inserted from said opposite side of said body means through said cavity to effect detachment of said mask pin from said body means.

9. An electrical component as set forth in claim 8, further comprising said electrically conducting member, and wherein said opening means has wall means defining with said portion of said masking means a clearance, and said electrically conducting member has a first part located in said cavity and a second part passing through said clearance and extending from said one side of said body means for soldered connection to the conductive path on the circuit board.

10. An electrical component as set forth in claim 9, wherein said second part of said electrically conducting member includes a solder tail at least partially coextensive with said masking means for inserting with said masking means into the hole in the circuit board.

11. An electrical component as set forth in claim 10, wherein said first part of said conducting member includes contacting means for electrically connecting with an external member inserted to engagement therewith from either one of said one and opposite sides.

12. An electrical component as set forth in claim 9, wherein said first part includes means for biting into said body means within said cavity for securing said first part to said body means.

13. An electrical component as set forth in claim 6 further comprising said electrically conducting member, and wherein said opening means has wall means defining with said portion of said masking means a clearance, and said electrically conducting member has a first part located in said cavity and a second part passing through said clearance and extending from said one side of said body means for soldered connection to the conductive path on the circuit board.

14. An electrical component as set forth in claim 13, wherein said second part of said electrically conducting member includes a solder tail at least partially coextensive with said masking means for inserting with said masking means into the hole in the circuit board.

15. An electrical component as set forth in claim 14, wherein said first part of said conducting member includes contacting means for electrically connecting with an external member.

16. An electrical component as set forth in claim 5, comprising a plurality of said masking means arranged in a row along said one side of said body means and each connected to said body means by a respective said frangible connecting means.

17. An electrical component as set forth in claim 16, wherein said body means includes a plurality of cavities and respective opening means at said one side of said body means for permitting access to said cavities, and said plurality of masking means having portions thereof disposed to block flow of molten solder through at least some of said opening means for preventing solder from filling at least some of said cavities.

18. An electrical component as set forth in claim 17, further comprising a plurality of said electrically conducting members, and wherein each said opening means has wall means defining with said portion of a respective said masking means a clearance, and each said electrically conducting member has a first part located in a respective said cavity and a second part passing through a respective said clearance and extending from said one side of said body means for soldered connection to a respective conductive path on the circuit board.

19. An electrical component as set forth in claim 18, wherein said plurality of masking means includes a plurality of generally parallel mask pins arranged in a row along said one side of said body means, and said second part of each said electrically conducting member includes a solder tail at least partially coextensive with a respective said masking means for inserting with said masking means into a hole in the circuit board, and said solder tails of said electrically conducting members are alernately disposed on opposite sides of said mask pins along said row.

20. An electrical component as set forth in claim 19, wherein said first part of each said conducting member includes contacting means for electrically connecting with an external member inserted to engagement therewith.

21. An electrical component as set forth in claim 16, further comprising a plurality of said electrically conducting members each having a solder tail at least partially coextensive with a respective said masking means for inserting with said masking means into the hole in the circuit board.

22. An electrical component as set forth in claim 21, wherein said said conducting member includes contacting means for electrically connecting with an external member.

23. An electrical component to be mounted to a circuit board, comprising:
an electrically nonconducting body having a cavity and opening means at one side of said body for permitting access to said cavity;
an electrically conducting member mounted within said cavity, said electrically conducting member including solder tail means extending through said opening means and from said one side of said body for inserting into a hole in a circuit board and for electrically connecting with a conductive path on the circuit board by soldering;
masking means proximate said opening means for blocking flow of molten solder through said opening means for preventing solder from filling said cavity; and
frangible connecting means for connecting said masking means to said body until said solder tail means is soldered to the conductive path on the circuit board and for permitting detachment of said masking means from said body after such soldering thereby to open said opening means for providing access to said cavity from said one side of said body.

24. An electrical component as set forth in claim 23, wherein said conducting member includes contacting means housed within said cavity for electrically connecting with an external member inserted into said cavity.

25. A female header to be mounted on a circuit board, comprising an electrically nonconducting body, an electrically conducting member mounted in said body, said conducting member having connecting means disposed within a through-cavity in said body and a solder tail extending from said body at one end of said through cavity, and a solder mask pin extending from said proximate said solder tail for insertion with said solder tail in a hole in a circuit board, said solder mask pin being joined to said body by a frangible connection, whereby said solder tial may be soldered to the circuit board and then the solder mask detached from said body to give access through the hole to the through-cavity in said body.

* * * * *

UNITED STATES PATENT AND TRADEMARK OFFICE
CERTIFICATE OF CORRECTION

PATENT NO. : 4,750,889
DATED : June 14, 1988
INVENTOR(S) : Martin C. Ignasiak and Remi D. Swierczek It is certified that error appears in the above-identified patent and that said Letters Patent is hereby corrected as shown below:

Claim 18, line 6, "ina" should read --in a--.

Claim 25, line 7, after "said" the word --body-- should be inserted.

Claim 25, line 11, the term "tial" should be correctly spelled --tail--.

Signed and Sealed this

Twenty-third Day of May, 1989

*Attest:*

DONALD J. QUIGG

*Attesting Officer*   *Commissioner of Patents and Trademarks*